US008716060B2

(12) United States Patent
Kraus et al.

(10) Patent No.: US 8,716,060 B2
(45) Date of Patent: *May 6, 2014

(54) CONFINED RESISTANCE VARIABLE MEMORY CELL STRUCTURES AND METHODS

(71) Applicant: Micron Technology, Inc., Boise, ID (US)

(72) Inventors: Brenda D. Kraus, Boise, ID (US); Eugene P. Marsh, Boise, ID (US); Timothy A. Quick, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/894,059

(22) Filed: May 14, 2013

(65) Prior Publication Data
US 2013/0252396 A1 Sep. 26, 2013

Related U.S. Application Data

(63) Continuation of application No. 13/403,443, filed on Feb. 23, 2012, now abandoned, which is a continuation of application No. 12/843,695, filed on Jul. 26, 2010, now Pat. No. 8,124,445.

(51) Int. Cl.
*H01L 21/00* (2006.01)
(52) U.S. Cl.
USPC .......................................... 438/102; 438/637
(58) Field of Classification Search
USPC .................. 438/102, 103, 637–640
See application file for complete search history.

(56) References Cited

U.S. PATENT DOCUMENTS

| 6,881,623 | B2 | 4/2005 | Campbell et al. |
| 6,955,940 | B2 | 10/2005 | Campbell et al. |
| 7,384,825 | B2 | 6/2008 | Park et al. |
| 7,442,603 | B2 | 10/2008 | Lai et al. |
| 7,488,967 | B2 | 2/2009 | Burr et al. |
| 7,598,112 | B2 | 10/2009 | Park et al. |
| 8,124,445 | B2 * | 2/2012 | Kraus et al. .................. 438/102 |
| 8,455,296 | B2 * | 6/2013 | Marsh et al. .................. 438/95 |
| 2008/0108174 | A1 | 5/2008 | Park et al. |
| 2008/0303014 | A1 | 12/2008 | Goux et al. |
| 2009/0111263 | A1 | 4/2009 | Chen et al. |
| 2009/0112009 | A1 | 4/2009 | Chen et al. |

(Continued)

OTHER PUBLICATIONS

Vilijami Pore, et al. "Atomic Layer Deposition of Metal Tellurides and Selenides Using Alkylsilyl Compounds of Tellurium and Selenium". Journal of the American Chemical Society. Publication Date (Web) Jan. 5, 2009. Downloaded from http://pubs.acs.org on Mar. 3, 2009. (4 pgs.).

(Continued)

*Primary Examiner* — Richard Booth
(74) *Attorney, Agent, or Firm* — Brooks, Cameron & Huebsch, PLLC

(57) ABSTRACT

Confined resistance variable memory cell structures and methods are described herein. One or more methods of forming a confined resistance variable memory cell structure includes forming a via in a memory cell structure and forming a resistance variable material in the via by performing a process that includes providing a germanium amidinate precursor and a first reactant to a process chamber having the memory cell structure therein and providing an antimony ethoxide precursor and a second reactant to the process chamber subsequent to removing excess germanium.

19 Claims, 3 Drawing Sheets

(56) References Cited

U.S. PATENT DOCUMENTS

| | | |
|---|---|---|
| 2009/0137100 A1 | 5/2009 | Xiao et al. |
| 2009/0142881 A1 | 6/2009 | Xiao et al. |
| 2009/0275164 A1 | 11/2009 | Chen et al. |
| 2009/0280052 A1 | 11/2009 | Xiao et al. |
| 2009/0305458 A1 | 12/2009 | Hunks et al. |
| 2010/0009164 A1 | 1/2010 | McFeely et al. |
| 2010/0130013 A1 | 5/2010 | Liu et al. |

OTHER PUBLICATIONS

S. Harnsoongnoen, et al. "Confined-Chalcogenide Phase Change Memory With Thin Metal Interlayer for Low Reset Current by Finite Element Modeling". Solid State Phenomena vols. 152-153 (2009). (5 pgs.).

* cited by examiner

CONFINED RESISTANCE VARIABLE MEMORY CELL STRUCTURES AND METHODS

PRIORITY APPLICATION INFORMATION

This application is a Continuation of Ser. No. 13/403,443, filed Feb. 23, 2012, which is a Continuation of U.S. application Ser. No. 12/843,695, filed Jul. 26, 2010, now U.S. Pat. No. 8,124,445, the specification of which is incorporated herein by reference.

TECHNICAL FIELD

The present disclosure relates generally to semiconductor memory devices, methods, and systems, and more particularly, to confined resistance variable memory cell structures and methods.

BACKGROUND

Memory devices are typically provided as internal, semiconductor, integrated circuits in computers or other electronic devices. There are many different types of memory, including random-access memory (RAM), read only memory (ROM), dynamic random access memory (DRAM), synchronous dynamic random access memory (SDRAM), flash memory, and resistance variable memory, such as phase change random access memory (PCRAM) and resistive random access memory (RRAM), among others.

The phase change material of a PCRAM device may exist in an amorphous, higher resistance state, or a crystalline, lower resistance state. The resistance state of the PCRAM cell may be altered by applying sources of energy to the cell, such as current pulses or pulses of light, among other sources of energy. For example, the resistance state of the PCRAM cell may be altered by heating the cell with a programming current. This results in the PCRAM cell being programmed to a particular resistance state, which can correspond to a data state. PCRAM devices may also be configured to provide multi-level storage. That is, the memory device may have a plurality of discrete and identifiable states which allow for multi-bit storage in a single memory cell.

Among various phase change materials used for memory devices, one common type includes a phase change chalcogenide alloy such as a Germanium-Antimony-Tellurium (GST) material. The solid phases of GST can rapidly change from crystalline state to amorphous state or vise versa upon heating and cooling cycles. The amorphous GST has relatively higher electrical resistance while the crystalline GST has relatively lower electrical resistance.

One challenge in designing PCRAM cells is that in order to overcome the heat dissipation during the switching of GST materials from crystalline to amorphous states, a high level of reset current has to be applied. This heat dissipation, however, can be reduced by confining GST material into vias (e.g., contact vias or contact holes) thus reducing the reset current needed for the action. Since the GST contact plugs are of high aspect ratio structure, conventional sputtering processes for GST film deposition are not suitable for achieving conformality.

DETAILED DESCRIPTION

Confined resistance variable memory cell structures and methods are described herein. One or more methods of forming a confined resistance variable memory cell structure includes forming a via in a memory cell structure and forming a resistance variable material in the via by performing a process that includes providing a germanium amidinate precursor and a first reactant to a process chamber having the memory cell structure therein and providing an antimony ethoxide precursor and a second reactant to the process chamber subsequent to removing excess germanium. One or more methods include providing a di-t-butyl telluride precursor in the absence of additional reactant to the chamber subsequent to removing excess first and second reactant from the chamber.

Embodiments of the present disclosure can provide conformal deposition within confined via structures. Embodiments can provide various benefits including reduced reset currents as compared to previous approaches. Embodiments can also reduce the number of process steps required to produce a confined resistance variable memory cell structure as compared to previous atomic layer deposition (ALD) approaches and/or can provide increased throughput while achieving a target conformality associated with a confined resistance variable memory cell structure as compared to previous atomic layer deposition (ALD) approaches, for instance. Embodiments also provide confined resistance variable memory cell structures in which the resistance variable material (e.g., phase change material) has little or no contaminants (e.g., composition uniformity) and exhibits improved adhesion to conductive contacts.

As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate the embodiments of the present disclosure and should not be taken in a limiting sense.

Figure 1A:
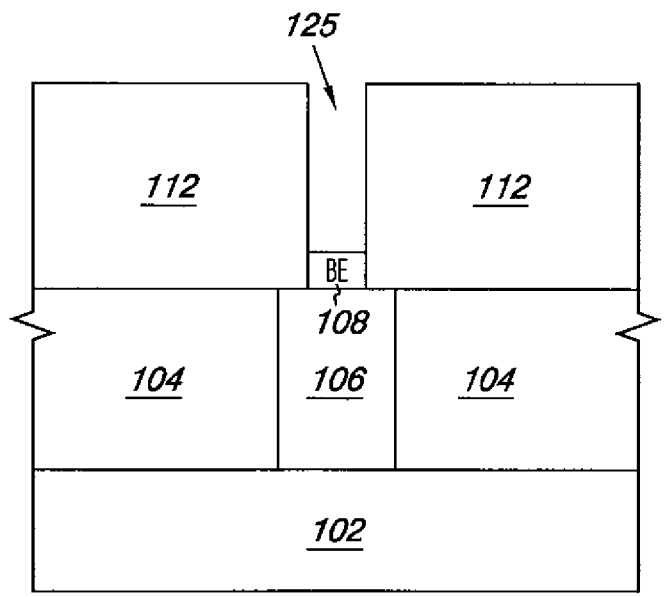
FIGS. 1A-1C illustrate process steps associated with forming a confined resistance variable memory cell structure in accordance with one or more embodiments of the present disclosure.
Figure 1B:
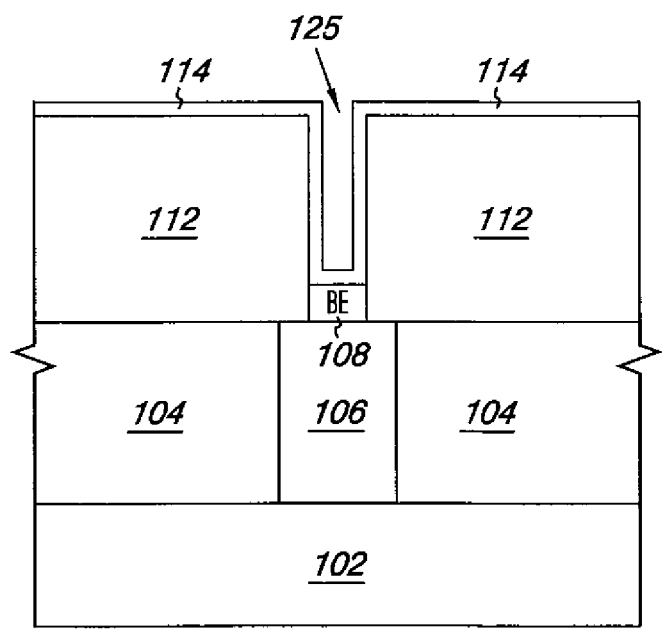
Figure 1C:
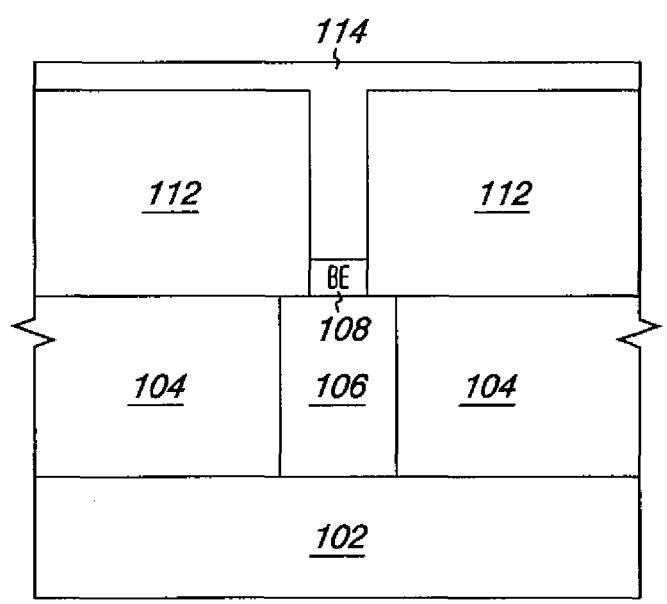

FIGS. 1A-1C illustrate process steps associated with forming a confined resistance variable memory cell structure in accordance with one or more embodiments of the present disclosure. The memory cell structure shown in FIGS. 1A-1C includes a base semiconductor structure that includes a substrate 102 including a conductive contact 106 formed in a dielectric material 104. The substrate 102 can be a silicon substrate, silicon on insulator (SOI) substrate, or silicon on sapphire (SOS) substrate, among others. The dielectric material 104 can be a nitride or oxide such as silicon dioxide ($SiO_2$), among other dielectric materials. The conductive contact 106 can be made of tungsten (W) or other suitable conductive material and can be formed in the dielectric layer 104 via a masking and etching process, for instance.

The structure includes a via 125 formed over a bottom electrode (BE) 108. In this example, the via 125 is formed through a dielectric material 112 (e.g., silicon dioxide) to expose the top surface of the bottom electrode 108 and can be referred to as a contact hole or contact via 125. In one or more embodiments, the via 125 has a diameter of not greater than 20 nanometers (nm). However, embodiments are not limited to a particular diameter of via 125, which can be formed by masking and etching, among other suitable processes.

The bottom electrode 108 can be made of various conductive materials or composite structures including TiN (titanium nitride), TaN (tantalum nitride), copper, iridium, platinum, ruthenium, and/or tungsten, for example. The bottom electrode 108 is formed on conductive contact 104. Although not shown in FIGS. 1A-1C, the contact 106 can be coupled to an access device (e.g., an access transistor) corresponding to a particular memory cell (e.g., a resistance variable memory cell such as a PCRAM cell or RRAM cell). Also, the conductive contact 106 can serve as a bottom electrode of a memory cell such that bottom electrode 108 may be optional, in one or more embodiments.

FIG. 1B illustrates a resistance variable material 114 formed on the structure illustrated in FIG. 1A. As such, the material 114 is formed over the bottom electrode 108, the walls of the via 125, and the exposed portions of the dielectric material 112. The material 114 can be formed (e.g., deposited), for example, in accordance with one or more methods described herein below. In one or more embodiments, the material 114 can be conformally deposited on the structure to a desired target thickness (e.g., 1-10 nm).

In various embodiments, and as illustrated in FIG. 1C, the material 114 can be deposited until the contact via 125 may be filled, partially or completely, with material 114. As one of ordinary skill in the art will appreciate, the structure illustrated in FIG. 1C can be further processed via chemical mechanical planarization (CMP), for instance, such that the material 114 is confined within contact via 125 (e.g., the material 114 can be planarized to the surface of material 112).

Although not illustrated in FIG. 1C, a conductive material (e.g., a top electrode) can be formed on the structure and patterned. One of ordinary skill in the art will also appreciate that an array of resistance variable memory cells would include a number of memory cell structures and additional memory components. For instance, a PCRAM and/or RRAM array could include access devices (e.g., access transistors) formed on substrate 102. The bottom electrode 108 can be coupled to an access device (e.g., to a source or drain region via contact plug 106) and a top electrode can be coupled to one or more bit lines (e.g., via contact plugs), for example.

The material 114 can be a phase change material 114. In one or more embodiments, the phase change material 114 can be a germanium-antimony (Ge—Sb) phase change material. In such embodiments, the phase change material can have an atomic composition of about 2-30% Ge and about 70-98% Sb. In one or more embodiments, the atomic composition is about 15% Ge and about 85% Sb.

In one or more embodiments, the resistance variable material 114 can be a phase change chalcogenide alloy such as a Germanium-Antimony-Tellurium (GST) material (e.g., a Ge—Sb—Te material such as $GeSb_7Te_2$, $Ge_2Sb_2Te_5$, $Ge_2Sb_2Te_7$, $Ge_1Sb_2Te_4$, $Ge_1Sb_2Te_5$, $Ge_1Sb_4Te_7$, etc.). The hyphenated chemical composition notation, as used herein, indicates the elements included in a particular mixture or compound, and is intended to represent all stoichiometries involving the indicated elements. Other phase change materials can include alloys of: Ge—Te, In—Se, Sb—Te, Ga—Sb, In—Sb, As—Te, Al—Te, Ge—Sb—Te, Te—Ge—As, In—Sb—Te, Te—Sn—Se, Ge—Se—Ga, Bi—Se—Sb, Ga—Se—Te, Sn—Sb—Te, In—Sb—Ge, Te—Ge—Sb—S, Te—Ge—Sn—O, Te—Ge—Sn—Au, Pd—Te—Ge—Sn, In—Se—Ti—Co, Ge—Sb—Te—Pd, Ge—Sb—Te—Co, Sb—Te—Bi—Se, Ag—In—Sb—Te, Ge—Sb—Se—Te, Ge—Sn—Sb—Te, Ge—Te—Sn—Ni, Ge—Te—Sn—Pd, and Ge—Te—Sn—Pt, among various other phase change materials.

Figure 2:
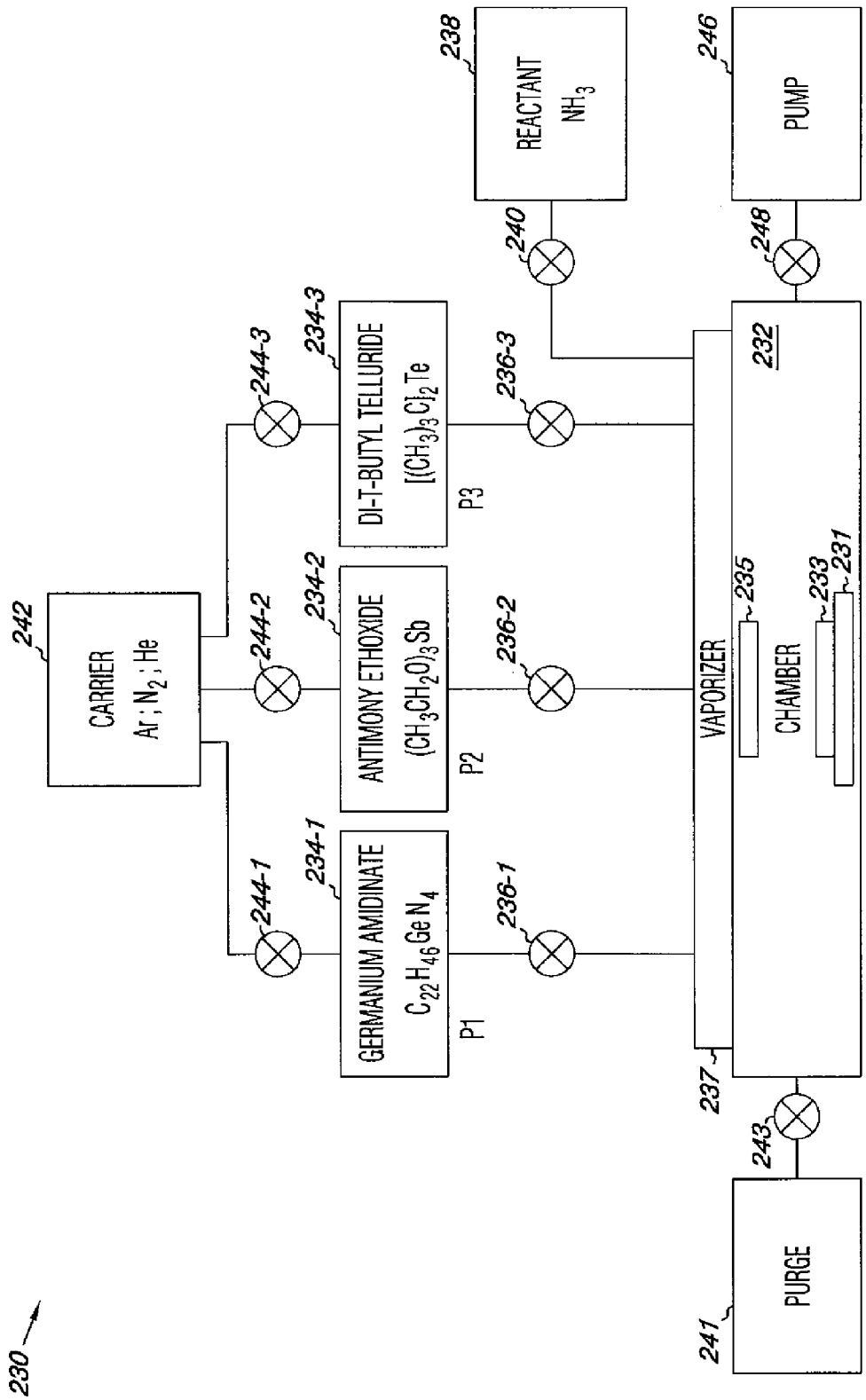
FIG. 2 illustrates an example of a system for forming confined resistance variable memory cell structures in accordance with embodiments of the present disclosure.

FIG. 2 illustrates an example of a system 230 for forming confined resistance variable memory cell structures in accordance with embodiments of the present disclosure. The system 230 includes a deposition chamber (e.g., reactor) 232. In operation, a memory cell structure 233 such as that illustrated in FIG. 1A can be positioned on a holder 231 (e.g., a revolving susceptor) within the chamber 232. The system 230 includes a vacuum pump 246 that can be opened and closed via valve 248.

The system 230 includes a number of sources 234-1, 234-2, and 234-3 from which precursors P1, P2, and P3, respectively, can be provided to the reaction chamber 232 via respective valves 236-1, 236-2, and 236-3. One or more of the precursors can be introduced (e.g., pulsed) into a vaporizer 237 and then distributed over the structure 233 via a showerhead 235, for instance. In various embodiments, the vaporizer 237 can be optional (e.g., the sources 234-1, 234-2, 234-3, and/or 242 can be introduced into the chamber 232 without first being provided to the vaporizer).

In the example illustrated in FIG. 2, the precursor P1 is a germanium (Ge) precursor, the precursor P2 is an antimony (Sb) precursor, and the precursor P3 is a tellurium (Te) precursor. In one or more embodiments, the Ge precursor P1 is germanium amidinate (e.g., 0.2M in toluene), $(C_{22}H_{46}GeN_4$, the antimony precursor P2 is antimony ethoxide, $(CH_3CH_2O)_3$ Sb, and the tellurium precursor P3 is di-t-butyl telluride, $[(CH_3)_3C]_2Te$.

The system 230 includes one or more carrier sources 242 (e.g., a "push" source) that can contain one or more inert gases (e.g., Ar, $N_2$, He as shown in FIG. 2) that can be used to assist one or more precursors (e.g., P1, P2, and P3) into chamber 232. The system 230 includes valves 244-1, 244-2, and 244-3 that can be used to control flow of the carrier gases. The system 230 also includes a purge source 241 that can be used and/or to remove excess precursor from the chamber 232 (e.g., during one or more purge processes) via operation of valve 243.

The system 230 also includes a reactant source 238 from which one or more reactants can be provide to chamber 232 via operation of valve 240. In one or more embodiments, the reactant is ammonia, $NH_3$.

The system 230 can be used to form confined resistance variable memory cell structures according to embodiments described herein. In one or more embodiments, forming a germanium-antimony (GeSb) resistance variable material (e.g., 114) in a contact via (e.g., 125) includes providing a germanium amidinate precursor 234-1 and a first reactant (e.g., ammonia) to the process chamber 232 having the memory cell structure 233 therein. The germanium amidinate precursor 234-1 can be pulsed into a vaporizer 237 and can be deposited over the memory cell structure 233 via a showerhead 235, for example. The reactant 238 is also introduced into the chamber 232 and reacts with the germanium amidinate 234-1 to form Ge on the memory cell structure 233. The reactant 238 can be introduced into chamber 232 directly, via the showerhead 235, or via a separate showerhead (not shown). A purge process can be used to remove excess Ge from the chamber 232.

Subsequent to removal of the excess Ge, the antimony ethoxide precursor 234-2 and a second reactant are provided to the process chamber 232. In various embodiments, at least one of the first and second reactant is ammonia. The first and second reactant can be the same reactant. Embodiments are not limited to a particular reactant 238. One or more embodiments can include maintaining flow of the reactant 238 to the chamber 232 during the process.

The antimony ethoxide precursor 234-2 can be pulsed into a vaporizer 237 and introduced into the chamber 233 along with the reactant 238 such that Sb is deposited over the previously deposited Ge. A purge process can then be used to remove excess Sb from the chamber 232 (e.g., via pump 246). The above deposition process conformally forms GeSb phase change material on the memory cell structure 233. The process can be repeated until a target thickness of the phase change material is achieved and/or until the contact via (e.g., 125) is filled. In some embodiments, the germanium amidinate precursor 234-1 and the antimony ethoxide precursor 234-2 can be pulsed into vaporizer 237 together.

In various embodiments, the GeSb material has a germanium concentration within a range of 2%-30% and an antimony concentration within a range of 70%-98%. The particular concentrations can depend on various deposition conditions such as chamber pressure, substrate temperature, vaporizer temperature, and flow rates, among other conditions. In one or more embodiments, and in the particular example described below, the germanium concentration is about 15% and the antimony concentration is about 85%. To achieve a Ge:Sb ratio of 15:85, the chamber pressure can be about 5 mbar (3.75 Torr), the substrate temperature can be about 320° C., the vaporizer temperature can be about 140° C., the flow rate of the carrier gas used to deliver the Ge can be about 10 sccm (standard cubic centimeters per minute), the flow rate of the carrier gas used to deliver the Sb can be about 80 sccm, and the ammonia reaction gas flow rate can be about 500 sccm.

In one or more embodiments, forming a germanium-antimony-tellurium (GeSbTe, or "GST") resistance variable material (e.g., 114) in a contact via (e.g., 125) includes providing a germanium amidinate precursor 234-1 and a first reactant (e.g., ammonia) to the process chamber 232 having the memory cell structure 233 therein. As described above, a purge process can be used to remove excess Ge, and an antimony ethoxide precursor 234-2 can be subsequently provided to the process chamber 232 along with a reactant 238 such that Sb is deposited over the previously deposited Ge. A purge process can then be used to remove excess Sb from the chamber 232.

Forming the GST material includes providing a tellurium precursor 234-3 (e.g., di-t-butyl tellurium) to the process chamber 232 subsequent to removing the excess antimony. In various embodiments, remaining reactant (e.g., ammonia), which was previously introduced into the chamber with the antimony precursor 234-2, is removed (e.g., via a purge process) prior to providing the tellurium precursor 234-3 to the chamber 232. Also, the tellurium precursor 234-3 can be introduced to the chamber 232 in the absence of an additional reactant, resulting in deposition of Te over the previously deposited Sb and Ge. As such, the Te deposition does not require a reactant. Removing excess reactant 238 from the chamber 232 prior to introducing the tellurium precursor 234-3 can provide various benefits. For instance, it was determined that an ammonia reaction with di-t-butyl tellurium could produce a hazardous release of energy (e.g., an explosion).

Subsequent to the deposition of the Te, excess Te can be removed from the chamber 232 and the deposition processes of the Ge, Sb, and Te can be repeated (e.g., until a target GST thickness is achieved and/or until the contact via is filled). In this manner, the above deposition process conformally forms GST phase change material on the memory cell structure 233. The GST material can be formed such that it has a target composition ratio. For example, in various embodiments, the GST material is $GeSb_7Te_2$. That is, the GST material has a molar composition ratio (Ge:Sb:Te) of 1:7:2. However, embodiments are not limited to a particular molar composition ratio. For instance, the molar composition ratio can be within a range of 0-30:50-90:0-30.

The particular composition ratio can depend on various deposition conditions such as chamber pressure, substrate temperature, vaporizer temperature, and flow rates, among other conditions. In one or more embodiments, and in the particular example described below, the GST material has a molar composition ratio of 1:7:2. To achieve a Ge:Sb:Te ratio of 1:7:2, the chamber pressure can be about 5 mbar (3.75 Torr), the substrate temperature can be about 320° C., the vaporizer temperature can be about 140° C., the Ge flow rate can be about 10 sccm, the Sb flow rate can be about 80 sccm, the Te flow rate can be about 100 sccm, and the ammonia reaction gas flow rate can be about 500 sccm. Performing the process at a temperature of less than 350° C. can provide increased adhesion to the conductive contact (e.g., bottom electrode 108 shown in FIGS. 1A-1C), for example.

Embodiments of the present disclosure can provide conformal deposition within confined via structures. Embodiments can provide various benefits including reduced reset currents as compared to previous approaches. Embodiments can provide increased throughput while achieving a target conformality associated with a confined resistance variable memory cell structure as compared to previous atomic layer deposition (ALD) approaches, for instance. Embodiments also provide confined resistance variable memory cell structures in which the resistance variable material (e.g., phase change material) has little or no contaminants (e.g., composition uniformity) and exhibits improved adhesion to conductive contacts.

Confined resistance variable memory cell structures and methods are described herein. One or more methods of forming a confined resistance variable memory cell structure includes forming a via in a memory cell structure and forming a resistance variable material in the via by performing a process that includes providing a germanium amidinate precursor and a first reactant to a process chamber having the memory cell structure therein and providing an antimony ethoxide precursor and a second reactant to the process chamber subsequent to removing excess germanium.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

In the foregoing Detailed Description, various features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method, comprising:
 forming a via in a memory cell structure;
 forming a resistance variable material in the via by:
  providing a germanium precursor and a first reactant to a process chamber having the memory cell structure therein; and
  providing an antimony ethoxide precursor and a second reactant to the process chamber subsequent to removing excess germanium.

2. A method, comprising:
 forming a via in a memory cell structure;
 forming a resistance variable material in the via by:
  providing a germanium precursor and a first reactant to a process chamber having the memory cell structure therein;
  providing an antimony ethoxide precursor and a second reactant to the process chamber; and
  providing a tellurium precursor to the process chamber subsequent to removing excess antimony.

3. The method of claim 2, including providing the tellurium precursor to the process chamber in the absence of an additional reactant.

4. The method of claim 3, wherein the tellurium precursor is di-t-butyl telluride.

5. The method of claim 4, wherein at least one the first and the second reactant is ammonia, and wherein the method includes removing excess ammonia from the chamber prior to introducing the di-t-butyl telluride.

6. The method of claim 3, wherein forming the resistance variable material includes forming a GeSbTe (GST) material having a composition ratio of about 1:7:2.

7. The method of claim 1, wherein the germanium precursor is a germanium amidinate precursor.

8. The method of claim 1, wherein the first and the second reactant is ammonia.

9. The method of claim 1, wherein forming the resistance variable material comprises forming a GeSb resistance variable material having a germanium composition within a range of 2%-30% and an antimony concentration within a range of 70%-98%.

10. A method, comprising:
 forming a via in a memory cell structure;
 forming a resistance variable material in the via by:
  providing a germanium precursor to a process chamber having the memory cell structure therein;
  providing an antimony ethoxide precursor to the process chamber subsequent to removing excess germanium; and
  maintaining a flow of a reactant to the chamber during the process.

11. The method of claim 10, including repeating the process at least until the via is filled with the resistance variable material.

12. The method of claim 10, including using a carrier gas to deliver the germanium precursor and the antimony ethoxide precursor to the chamber.

13. The method of claim 10, wherein the reactant is ammonia.

14. The method of claim 10, wherein the geimanium precursor is a germanium amidinate precursor.

15. A method, comprising:
 introducing a germanium precursor and a first reactant to a process chamber having a memory cell structure therein;
 introducing an antimony ethoxide precursor and a second reactant to the process chamber subsequent to removing excess germanium; and
 introducing a telluride precursor in the absence of additional reactant to the chamber subsequent to removing excess first and second reactant from the chamber.

16. The method of claim 15, wherein the telluride precursor is a di-t-butyl telluride precursor and wherein the method includes removing excess antimony from the chamber prior to introducing the di-t-butyl telluride precursor to the chamber.

17. The method of claim 15, including removing excess antimony from the chamber prior to providing the di-t-butyl telluride precursor to the chamber.

18. The method of claim 15, including performing the method such that a GeSbTe (GST) resistance variable material having a target composition ratio is formed in a via formed in the memory cell structure.

19. The method of claim 15, further including vaporizing the germanium precursor, the antimony ethoxide precursor, and the telluride precursor prior to introducing them to the chamber.

* * * * *

UNITED STATES PATENT AND TRADEMARK OFFICE
CERTIFICATE OF CORRECTION

Page 1 of 1

PATENT NO. : 8,716,060 B2
APPLICATION NO. : 13/894059
DATED : May 6, 2014
INVENTOR(S) : Brenda D. Kraus et al.

It is certified that error appears in the above-identified patent and that said Letters Patent is hereby corrected as shown below:

In the Claims

In column 7, line 30, in Claim 5, after "one" insert -- of --.
In column 8, line 18, in Claim 14, delete "geimanium" and insert -- germanium --, therefor.

Signed and Sealed this
Nineteenth Day of August, 2014

Michelle K. Lee
*Deputy Director of the United States Patent and Trademark Office*